United States Patent [19]

Mitsui et al.

[11] Patent Number: 5,049,029
[45] Date of Patent: Sep. 17, 1991

[54] HANDLING APPARATUS FOR TRANSFERRING A SEMICONDUCTOR WAFER OR LCD

[75] Inventors: Tadashi Mitsui, Yamanashi; Susumu Saito, Kofu, both of Japan

[73] Assignee: Tokyo Electron Limited, Tokyo, Japan

[21] Appl. No.: 506,537

[22] Filed: Apr. 9, 1990

Related U.S. Application Data

[63] Continuation of Ser. No. 242,131, Sep. 9, 1988, abandoned.

[30] Foreign Application Priority Data

Sep. 10, 1987 [JP] Japan .................. 62-226896

[51] Int. Cl.⁵ .......................... B25J 11/00
[52] U.S. Cl. ................ 414/744.5; 414/744.6; 414/749; 414/917; 414/222; 901/15; 901/21
[58] Field of Search .............. 414/695.6, 709, 222

[56] References Cited

U.S. PATENT DOCUMENTS

| | | | |
|---|---|---|---|
| 2,865,523 | 12/1958 | Morrison | 414/733 |
| 3,561,614 | 2/1971 | Tezuka et al. | 414/751 |
| 3,931,381 | 1/1976 | Lindberg | 264/233 X |
| 4,225,379 | 9/1980 | Ishii et al. | 156/153 X |
| 4,234,150 | 11/1980 | Mee et al. | 901/15 X |
| 4,329,110 | 5/1982 | Schmid | 414/917 X |
| 4,329,111 | 5/1982 | Schmid | 414/917 X |
| 4,341,502 | 7/1982 | Makino | 414/744.5 X |
| 4,583,907 | 4/1986 | Wimberley | 414/917 X |
| 4,584,045 | 4/1986 | Richards | 414/744.5 X |
| 4,728,252 | 3/1988 | Lada et al. | 414/744.5 |
| 4,749,330 | 6/1988 | Hine | 414/744.5 |

FOREIGN PATENT DOCUMENTS

| | | | |
|---|---|---|---|
| 0639435 | 2/1964 | Belgium | 901/15 |
| 0738760 | 8/1943 | Fed. Rep. of Germany | 901/15 |
| 60-61191 | 4/1985 | Japan . | |
| 60-183736 | 9/1985 | Japan . | |
| 61-87351 | 5/1986 | Japan . | |
| 61-90887 | 5/1986 | Japan . | |
| 61-90903 | 5/1986 | Japan . | |
| 61-160949 | 7/1986 | Japan . | |
| 62-65813 | 3/1987 | Japan . | |
| 0446414 | 5/1975 | U.S.S.R. | 901/21 |
| 0595224 | 2/1978 | U.S.S.R. | 414/749 |
| 601154 | 4/1978 | U.S.S.R. | 414/917 |
| 0642149 | 1/1979 | U.S.S.R. | 414/917 |
| 1217651 | 3/1986 | U.S.S.R. | 414/917 |

Primary Examiner—Robert J. Spar
Assistant Examiner—William M. Heinz
Attorney, Agent, or Firm—Oblon, Spivak, McClelland, Maier & Neustadt

[57] ABSTRACT

A handling apparatus includes a base member having a rotating shaft, of a multijoint arm having one end portion thereof connected to the rotating shaft, a holder mounted at the free end portion of the arm, for holding a wafer, a stepping motor for circling the holder together with the arm about the rotating shaft, and another stepping motor for pivoting the arm joints. The multijoint arm is constituted by a plurality of parallel crank mechanisms arranged on corresponding planes in parallel with the circling plane. One of the links constituting the first-stage parallel crank mechanism is fixed on the base member. During nonuse of the apparatus, the respective parallel crank mechanism overlap each other on the base member. Pulleys are mounted on joints of the arm, and a wire is wrapped around the pulleys. When at least one of the pulleys is pivoted, the parallel crank mechanisms are displaced, thereby extending or retracting the arm.

10 Claims, 4 Drawing Sheets

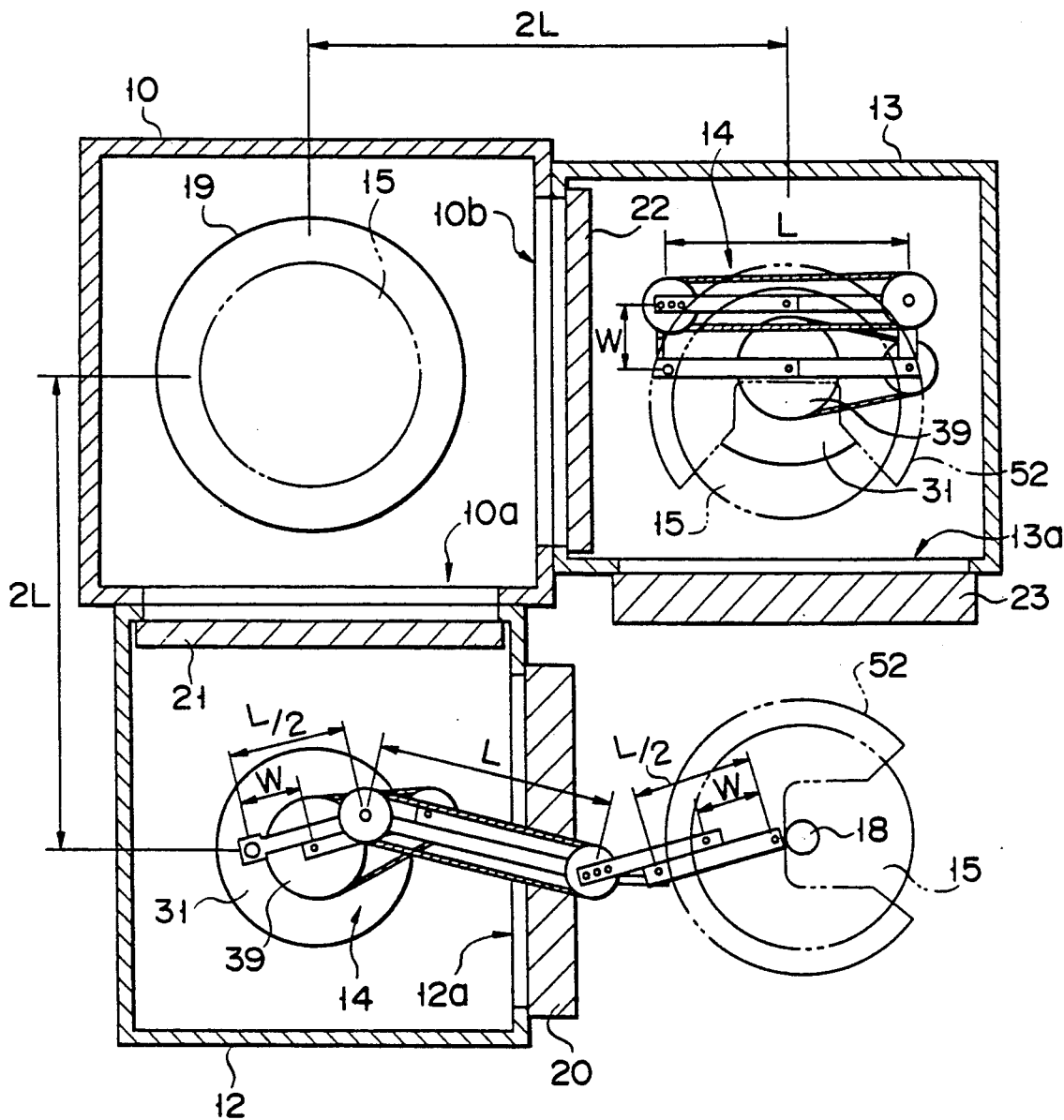
F I G. 1

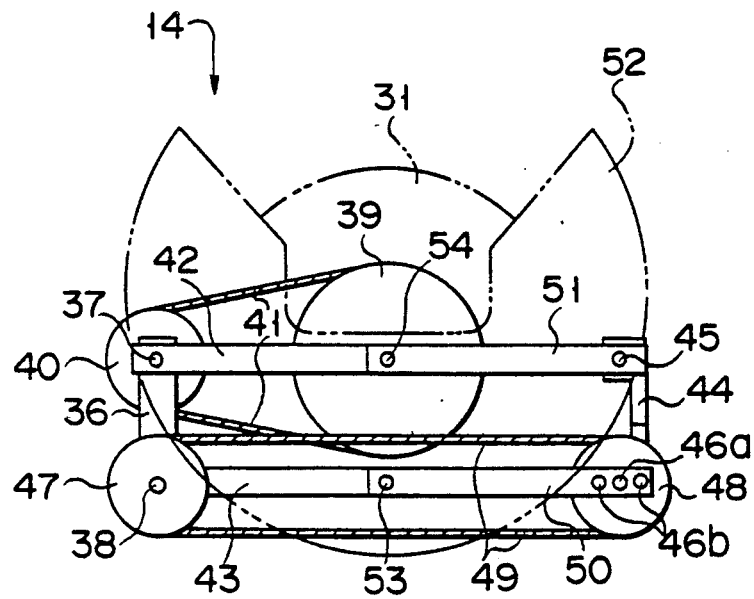
F I G. 3
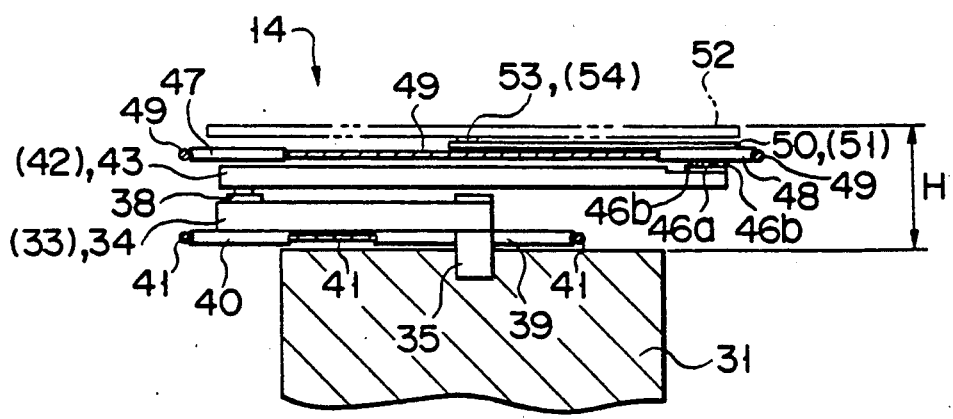
F I G. 4

HANDLING APPARATUS FOR TRANSFERRING A SEMICONDUCTOR WAFER OR LCD

This application is a continuation of application Ser. No. 07/242,131, filed on Sept. 9, 1988, now abandoned.

BACKGROUND OF THE INVENTION

1. Field of the Invention

The present invention relates to a handling apparatus for transferring, one by one, sheet-like objects such as semiconductor wafers or Liquid Crystal Displays (LCDs) and, more particularly, to a handling apparatus having a link mechanism which can be folded into a compact size.

2. Description of the Related Art

In the process of manufacturing semiconductor devices such as ICs and LSIs, semiconductor wafers are handled in a clean, dust-free room so as to prevent contamination of the micropatterned surfaces of semiconductor wafers by the attachment of particles such as dust thereto. A means for transferring semiconductor wafers in a clean room is a transporting mechanism of a belt conveyor or mechanical handle type. In particular, in processes such as etching and ion implantation which require a clean, dust-free environment a special handling apparatus is used in order to load or unload semiconductor wafers into/from a vacuum chamber, one by one. A sheet handling apparatus must satisfy requirements (1) and (2) so as to shorten the vacuum processing time and maintain a clean, dust-free environment:

(1) A space required for the handling apparatus during nonuse is small, and a transporting distance of the apparatus is long; and (2) The amount of dust generated during use of the apparatus is small.

In recent years, various types of handling apparatuses which satisfy the above requirements have been developed. A compact handling apparatus which generates a very small amount of dust is commercially available.

Semiconductor wafer handling apparatuses are disclosed in Japanese Utility Model Disclosure (Kokai) No. 60-61191 and Japanese Patent Disclosure Nos. 60-183736 and 61-160949. These handling apparatuses utilize "pantagraphs" as the arm of the transporting mechanisms.

More compact handling apparatuses are disclosed in Japanese Patent Disclosure Nos. 61-90903, 61-87351, and 61-90887.

In order to reduce the space required for storing conventional handling apparatuses during nonuse, the length of the arm of the pantagraph and the number of joints therein have been reduced, thereby limiting the area for transporting the objects to be processed. However, in the case wherein the transportable area is increased by lengthening the arm of the pantagraph and increasing the number of joints therein so as to increase the area for transporting the objects to be processed, the size of the apparatus during nonuse is undesirably increased.

A strong demand has arisen for processing semiconductor wafers, one by one, along with development of 4 and 16-mega-bit devices in accordance with an advance of VLSI techniques. In order to increase the throughput of such a sheet handling apparatus, a load lock mechanism is employed in the conventional handling apparatus. In order that such a load lock mechanism be provided, a dust-free transporting mechanism is required. It is very important to transport a larger wafer within a limited area due to dust-free.

A chamber for containing the handling apparatus and the vacuum chamber for processing the semiconductor wafer are partitioned by a gate valve. When the gate valve is open, the chamber (container) for containing the handling apparatus communicates with the vacuum chamber (container). Therefore, it takes a long period of time to remove the air from the vacuum chamber.

Furthermore, in a conventional handling apparatus, a substantial amount of dust is generated as compared with that of a drive mechanism in the handling apparatus. Dust enters and contaminates the vacuum chamber via the handling apparatus container.

In particular, in a clean room for handling VLSIs having a high integration density, the degree of cleanliness required is class 10 or higher. Therefore, since the conventional handling apparatuses do not meet this requirement, they are not suitable for handling VLSI semiconductor wafers.

SUMMARY OF THE INVENTION

It is a first object of the present invention to provide a handling apparatus which requires only a small container during nonuse and has a large transportable area for objects to be processed.

It is a second object of the present invention to provide a lightweight, compact handling apparatus with an excellent operability, wherein a very small amount of dust is generated by its mechanism during driving.

According to an aspect of the present invention, there is provided a handling apparatus comprising a base member having a rotating shaft, a multijoint arm having one end portion thereof connected to the rotating shaft, holding means, mounted at the free end portion of the multijoint arm, for holding an object to be transported, circling means for circling the holding means together with the multijoint arm about the rotating shaft, and means for rotating the arm at the joints to thereby extend or retract the multijoint arm, wherein the multijoint arm comprises a plurality of parallel crank mechanisms disposed on planes parallel to the circling plane, one of a plurality links constituting a first-stage of the plurality of parallel crank mechanisms is fixed to the base member.

In this case, the means for rotating the joints of the arm is preferably a wire wrapping mechanism which does not include a gear, a chain, or a belt.

More preferably, the means for rotating the joints of the arm is a mechanism wrapping a wire between pulleys.

More specifically, the pulleys are mounted on the joints of the arm, and at least one pulley is connected to a driving shaft of a stepping motor. The diameter of the pulley which receives a driving force from the stepping motor is preferably larger than the other pulleys. A ratio of the diameter of the large pulley to that of the small pulley is preferably an integer, and most preferably 2:1.

In this case, when the link and the pulleys are manufactured, a hard anodized aluminum (alumite) film is formed on an aluminum alloy surface thereof, and a tetrafluororesin is coated on the anodized aluminum film. The wire is preferably made of a stainless steel wire coated with a tetrafluororesin. The members made of the tetrafluororesin have an advantage in that a minimum amount of dust is generated during sliding.

The multijoint arm is constituted by a combination of a plurality of parallel crank mechanisms. Such a multijoint arm can be constituted by combining five or more parallel crank mechanisms, but more preferably it is constituted by a combination of three parallel crank mechanisms. In this case, the long link of the second-stage parallel crank mechanism is longer than those of the first- and third-stage parallel crank mechanisms. In particular, the ratio of the length of the long link of the first- or third-stage parallel crank mechanism to that of the second-stage parallel crank mechanism is preferably 1:2.

When the arm is folded, it is preferably fitted in a space defined between the base member and the holding means. A special holder is used as a wafer holding means therefor.

The multijoint arm can be operated in various positions. However, if the operating positions of the multijoint arm are limited, the multijoint arm is preferably mounted on the base member such that the arm can circle in a horizontal plane. In addition, preferably, the parallel crank mechanisms can be displaced on the corresponding horizontal planes.

BRIEF DESCRIPTION OF THE DRAWINGS

FIG. 1 is a plan view showing handling apparatuses respectively arranged in preliminary chambers when a vacuum chamber and two preliminary chambers of an etching apparatus have been cutaway;

FIG. 3 is a plan view of the handling apparatus during nonuse;

FIG. 4 is a side view of the handling apparatus during nonuse; and

DETAILED DESCRIPTION OF THE PREFERRED EMBODIMENTS

Figure 2:
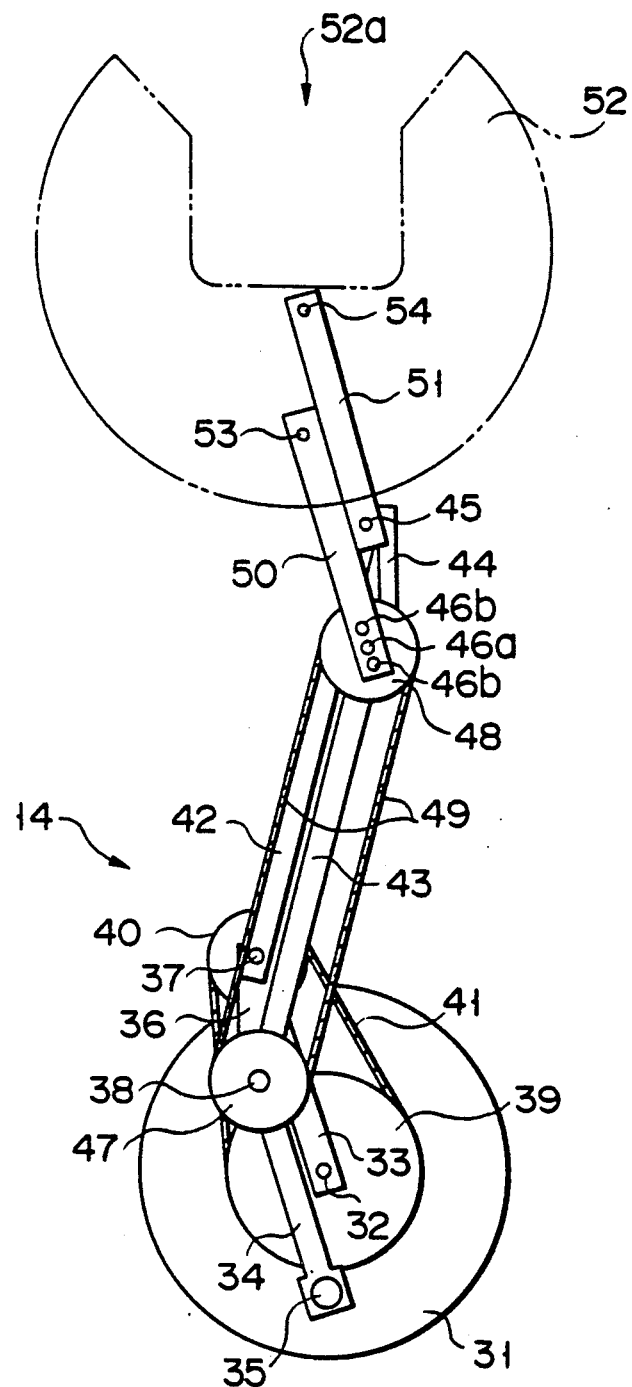
FIG. 2 is a plan view of the handling apparatus during use.

Various embodiments of the present invention will be described with reference to the accompanying drawings.

Referring to FIG. 1, an etching apparatus for etching silicon wafers 15, one by one, is arranged in a clean, dust-free room. The etching apparatus comprises vacuum chamber 10 for etching silicon wafer 15 on stage 19 in a vacuum and two preliminary chambers 12 and 13 for loading wafer 15 into vacuum chamber 10 or unloading it therefrom. Vacuum chamber 10 comprises a vacuum device (not shown) and an exposure device (not shown). Handling apparatuses 14 are respectively arranged in preliminary chambers 12 and 13. Vacuum chamber 10 has the following dimensions: 370 mm length ×370 mm width ×200 mm height; and each preliminary chamber 12 or 13 has the following dimensions: 300 mm length ×300 mm width ×80 mm height.

Vacuum chamber 10 and preliminary chambers 12 and 13 communicate with each other through openings 10a and 10b. Gate valves 21 and 22 are arranged in openings 10a and 10b, respectively. Preliminary chambers 12 and 13 communicate with the outer air through openings 12a and 13a. Gate valves 20 and 23 are arranged in openings 12a and 13a, respectively.

Each preliminary chamber 12 or 13 has a predetermined size for receiving one wafer which must be immediately discharged therefrom at a high speed since the wafer is exposed to the outer air during the process of loading and unloading the wafer. In order that a wafer be evacuated from a preliminary chamber within a desired period of time, the preliminary chamber must have a small volume, and the movement of handling apparatus 14 must be limited accordingly.

Stage 18 is arranged in front of opening 12a of preliminary chamber 12. When wafer 15 is loaded on stage 18 by a robot's hand (not shown), wafer 15 is automatically aligned on stage 18. First handling apparatus 14 in preliminary chamber 12 loads wafer 15 from aligning stage 18 to vacuum chamber 10. Then, second handling apparatus 14 arranged in preliminary chamber 13 unloads wafer 15 from vacuum chamber 10.

Each cylindrical base member 31 of handling apparatuses 14 is installed in the center of each of preliminary chambers 12 and 13, respectively. A rotating shaft of each base member 31 is connected to a driving shaft of a stepping motor (not shown) having a speed control means. An arm portion of handling apparatus 14 can be rotated by the stepping motor through a desired angle around the member 31. Distance 2L between the center of base member 31 and the center of stage 19 of vacuum chamber 10 is about 370 mm.

The arm of handling apparatus 14 is constituted by three parallel motion mechanisms (parallel crank mechanisms). While the apparatus is in use, a maximum arm length is 2L. While the apparatus is not being used, a space required for the folded arm is L × W × H, wherein W is 50 mm.

As shown in FIG. 2, holding member 52 is mounted at the distal end of the arm of handling apparatus 14. Holding member 52 is detachably mounted on the arm and can be replaced with another in accordance with the wafer sizes.

Figure 5:
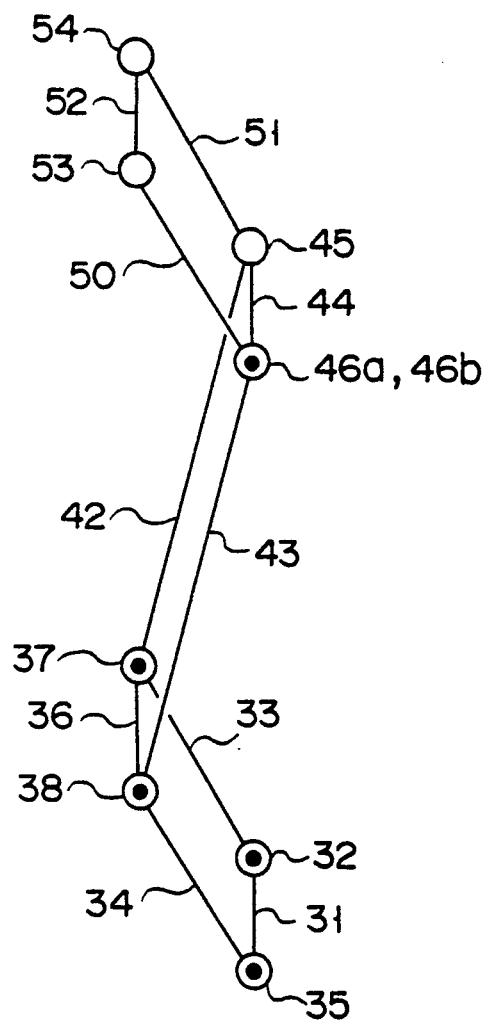
FIG. 5 is a skelton diagram of a combination of three parallel crank mechanisms constituting an arm of the handling apparatus.

The multijoint arm of the handling apparatus and its driving mechanism will be described with reference to FIGS. 5 and 2.

The multijoint arm of handling apparatus 14 is constituted by the assembly of three parallel crank mechanisms. The first-stage parallel crank mechanism comprises first to third links 33, 34, and 36 and base member 31. Large pulley 39 is coaxially fixed on shaft 32 of base member 31. Shaft 32 is fixed at one end of first link 33. One end of second link 34 is pivotally supported on base 31 by shaft 35 such that second link 34 is parallel to first link 33. Third link 36 is pivotally mounted on first and second links 33 and 34 through corresponding shafts 37 and 38. First to third links 33, 34, and 36 are mounted on the same plane.

The mechanism for driving the multijoint arm will be described below.

First small pulley 40 is fixed on shaft 37. Wire 41 is looped around large pulley 39 and first small pulley 40. A rotational force of shaft 32 is transmitted to small pulley 40 through wire 41. A ratio of the diameter of large pulley 39 to that of small pulley 40 is 2:1.

In this case, the length of each of first and second links 33 and 34 is L. The length of third link 36 and the distance between shafts 32 and 35 are each given as W. In this manner, base member 31 and first to third links 33, 34, and 36 constitute the first-stage parallel crank mechanism.

The second-stage parallel crank mechanism will be described below.

The second-stage parallel crank mechanism is arranged to overlap the first-stage parallel crank mechanism. One end of fourth link 42 is fixed on shaft 37, and one end of fifth link 43 is pivotally mounted on shaft 38. Sixth link 44 is pivotally coupled between fourth and fifth links 42 and 43 through shafts 45 and 46. The length of each of fourth and fifth links 42 and 43 is L, and the length of sixth link 44 is W, which is equal to that of third link 36. Third to sixth links 36, 42, 43, and 44 constitute the second-stage parallel crank mechanism. Second small pulley 47 is fixed on shaft 38, and third small pulley 48 is fixed on shaft 46a. Wire 49 is looped around second and third small pulleys 47 and 48. Second and third small pulleys 47 and 48 are identical to first small pulley 40.

The third-stage parallel crank mechanism will be described below.

The third-stage parallel crank mechanism is arranged to overlap the second parallel crank mechanism described above. The third parallel crank mechanism is constituted by sixth link 44, seventh link 50, eighth link 51, and holding member 52. One end of seventh link 50 is fixed on third pulley 48 by two screws 46b. The other end of seventh link 50 is pivotally mounted on holding member 52 through shaft 53. One end of eighth link 51 is pivotally mounted on sixth link 44 through shaft 45, and the other end thereof is pivotally mounted on holding member 52 through shaft 54. In this case, the length of each of seventh and eighth links 50 and 51 is L/2, and a distance between shafts 53 and 54 is W.

The length L is substantially equal to the diameter of the wafer to be handled. In a handling apparatus for handling an 8" wafer, length L is set to be about 180 mm and distance W preferably falls within the range of L/4 to L/2.

As shown in FIGS. 3 and 4, handling apparatus 14 is folded and can be stored in a small container while the apparatus is not in use. The area occupied by the folded arm is defined as L × W. Most of the folded arm is concealed below wafer holding member 52, and small pulleys 40, 47, and 48 protrude from under holding member 52.

The material of which the parallel crank mechanisms, the links constituting the driving mechanism, and the pulleys are composed, is stainless steel or an aluminum alloy with a tetrafluororesin coated thereon by so-called Tufram process. When an aluminum alloy is used as a base metal, a hard anodized aluminum film is formed on the surface of the base metal prior to the coating of a tetrafluororesin. Wires 41 and 49 are made of stainless steel wires coated with a tetrafluororesin. A titanium alloy may be employed as a material for the links, the pulleys, and the wires. The amount of tetrafluororesin coating material is small enough so that the formation of dust during sliding is inconsequential.

Loading of the silicon wafer into the etching (vacuum) chamber or unloading it therefrom by means of the handling apparatuses will be described below.

One of silicon wafers 15 is taken out from a wafer cassette by a robot hand (not shown) and is temporarily placed on stage 18. Wafer 15 on stage 18 is aligned in a desired position by a robot hand and a sensor (not shown). After wafer 15 has been prealigned on stage 18, gate valve 20 is moved downward to open opening 12a of the preliminary chamber.

The operation of the driving mechanism of handling apparatus 14 is controlled by a computer system in accordance with the so-called computer software programming. Base member 31 is rotated to direct wafer insertion port 52a of holding member 52 toward opening 12a. Shaft 32 is rotated at a low speed by a stepping motor to extend the arm of handling apparatus 14. Holding member 52 is moved forward toward wafer 15 placed on stage 18 and is caused to hold wafer 15. After wafer holding has been detected, the stepping motor is driven in the reverse direction to retract the arm. Wafer 15 is loaded in preliminary chamber 12 while being held by holding member 52. Gate valve 20 is moved upward to close opening 12a of preliminary chamber 12. The gas in preliminary chamber 12 is removed therefrom by a vacuum pump until an internal pressure of preliminary chamber 12 becomes equal to that of vacuum chamber 10. When the internal pressure of preliminary chamber 12 reaches a predetermined value, gate valve 21 is moved downward to cause preliminary chamber 12 to communicate with vacuum chamber 10. Base member 31 is rotated 90° counterclockwise to direct holding member 52 toward vacuum chamber 10.

Shaft 32 is forwardly rotated to extend the arm from preliminary chamber 12 to load wafer 15 in holding member 52 of vacuum chamber 10. Wafer 15 is transferred from holding member 52 to chuck 19. Shaft 32 is reversely rotated to retract the arm to return from holding member 52 of chamber 10 to preliminary chamber 12. Gate valve 21 is moved upward to block vacuum chamber 10 from preliminary chamber 12. Wafer 15 is etched in a hermetic state in vacuum chamber 10.

When etching has been completed, gate valve 22 is moved downward to cause evacuated preliminary chamber 13 to communicate with vacuum chamber 10. The arm of second handling apparatus 14 in preliminary chamber 13 is extended to cause holding member 52 to hold wafer 15 on chuck 19. When wafer 52 is detected as being held, shaft 32 is reversely rotated to retract the arm, and wafer 15 held by holding member 52 is transferred from vacuum chamber 10 to preliminary chamber 13. Gate valve 22 is upwardly moved to block preliminary chamber 13 from vacuum chamber 10. Base member 31 is rotated 90° counterclockwise to direct holding member 52 toward gate valve 23. Gate valve 23 is moved downward to open preliminary chamber 13. Shaft 32 is forwardly rotated to extend the arm. The wafer is unloaded from preliminary chamber 13 to the outside. After the wafer has been unloaded, the arm is retracted to return holding member 52 to preliminary chamber 13. Gate valve 23 is upwardly moved to close preliminary chamber 13. The air is evacuated from the chamber 13. Thus, preliminary chamber 13 is prepared to receive the next wafer.

The reason of straight movement of holding member 52 at the distal end of the arm upon extension of the arm of handling apparatus 14 will be described below.

The arm of each handling apparatus 14 comprises three parallel crank mechanisms. A ratio of the arm length of the first-stage parallel crank mechanism (first and second links 33 and 34) to the arm length of the second-stage parallel crank mechanism (fourth and fifth links 42 and 43) is set to be 1:2. A ratio of the diameter of small pulley 40, 47, or 48 to that of large pulley 39 is set to be 1:2. If an angular displacement of first link 33 directly driven by shaft 32 is given as $2\delta$, an angular displacement of fourth link 42 indirectly driven through small pulley 40 is given as $\delta$. Thus, a displacement of the distal end of first link 33 becomes ($2\delta \times L/2$). A displacement of the distal end of fourth link 42 is given as ($\delta \times L$). Therefore, these displacements cancel each other ($2\delta \times L/2 = \delta \times L$), so that the distal end of the arm is moved straight from base member 31.

Four or more parallel crank mechanisms may be combined in the above arm.

The space for containing the handling apparatus described above can be reduced to L×L×H when the apparatus is not in use, and its maximum transporting distance can be increased to 2L. For example, the space required for containing an 8" wafer transportation handling apparatus is 310 mm×310 mm×80 mm, and its maximum transporting distance is 370 mm. For this reason, the volume of the preliminary chamber for loading or unloading the wafer can be reduced. The preparation time prior to the vacuum processing can be greatly reduced.

According to the above embodiment, the links, the pulleys, and the wires are coated with a tetrafluororesin. Therefore, the settling of dust between the members can be minimized during sliding. The wires are not slid along the pulleys but are moved together therewith. For this reason, the amount of dust entering the vacuum chamber through the preliminary chamber can be minimized, and a clean, dust-free environment can be maintained within the vacuum chamber.

According to the above embodiment, the respective operations of the handling apparatus can be controlled utilizing computer software programming, and the silicon wafers can be automatically transported.

In the above embodiment, loading/unloading of the silicon wafer into/from the vacuum chamber of the etching apparatus by the handling apparatuses is exemplified. However, the present invention is not limited to this. Other semiconductor wafers and liquid crystal substrates (LCDs) can be loaded or unloaded into/from various processing and testing apparatuses.

According to the present invention, there is provided a lightweight, compact handling apparatus having a long transporting distance. In particular, the space occupied by the apparatus while it is not in use can be greatly reduced as compared with a conventional handling apparatus which utilizes a pantagraph mechanism. Therefore, the handling apparatus according to the present invention is suitable for the transportation of semiconductor wafers such as in an etching apparatus requiring vacuum processing. When the arm is constituted by three parallel crank mechanisms, the space wherein the handling apparatus is contained can be reduced to about 35% of conventional container.

According to the handling apparatus of the present invention, the settling of dust on the mechanism during driving can be minimized. The handling apparatus can be suitably used to process semiconductor wafers, one by one, in processing or testing apparatuses which require a high degree of cleanliness, such as an ion implantation apparatus and a probing machine.

What is claimed is:

1. A handling apparatus arranged in a clean atmosphere, comprising:
   a base member having a rotating shaft;
   a multijoint arm including one end portion thereof connected to said rotating shaft;
   holding means including a holding member mounted at a free end portion of said multijoint arm, for holding a plate-like object to be transported;
   rotating means for rotating said holding means; and
   bending means for bending said multijoint arm at the joints, to thereby extend or retract said multijoint arm;
   wherein said multijoint arm comprises at least three parallel link mechanisms which define first, second and third stages, each one of said at least three parallel link mechanisms comprising a plurality of links, the first-stage of said parallel link mechanisms being fixed to the base member, and, when the multijoint arm is retracted, said parallel link mechanisms are stored between the base member and the holding member such that the maximum length of the holding member is substantially equal to the maximum length of the parallel link mechanisms, wherein planes defined by said parallel link mechanisms are parallel to one another,
   wherein at least one pulley is mounted on each joint of said multijoint arm, at least one of said pulleys receiving a driving force from a wire.

2. The apparatus according to claim 1, wherein said bending means for bending said multijoint arm comprises a wire wrapping mechanism.

3. The apparatus according to claim 1, wherein a ratio of a diameter of said pulley which receives the driving force to a diameter of any other pulley is 2:1.

4. The apparatus according to claim 1, wherein said pulleys are formed such that a hard anodized aluminum film is formed on an aluminum alloy surface thereof, a tetrafluororesin coating is formed thereon, and said wire is formed such that a tetrafluororesin is coated on a stainless steel wire.

5. The apparatus according to claim 1, wherein a ratio of the length of a longest link of each of said first-and third-stage parallel link mechanisms to the length of a longest link of said second-stage parallel link mechanism is 1:2.

6. The apparatus according to claim 1, wherein members constituting said links of said parallel link mechanisms are made such that a hard anodized aluminum film is formed on an aluminum alloy surface thereof and then a tetrafluororesin coating is formed thereon.

7. The apparatus according to claim 1, wherein said multijoint arm is mounted on said base member so as to circularly move on a horizontal plane.

8. The apparatus according to claim 1, wherein said parallel link mechanisms constituting said multijoint arm are displaced on corresponding horizontal planes.

9. The apparatus according to claim 1, wherein said holding member is for holding a semiconductor wafer.

10. A processing apparatus arranged in a clean atmosphere, comprising:
   a vacuum chamber in which an object is processed, a volume of said vacuum chamber being such that the time required to exhaust gas and dust from said vacuum chamber is reduced;
   a preliminary chamber through which the object to be processed in said vacuum is transported; and
   a handling device located in said preliminary chamber, said handling means comprising:
   a base member having a rotating shaft;
   a multijoint arm including one end portion thereof connected to said rotating shaft;
   holding means including a holding member mounted at a free end portion of said multijoint arm, for holding a plate-like object to be transported;
   rotating means for rotating said holding means; and
   bending means for bending said multijoint arm at the joints, to thereby extend or retract said multijoint arm;
   wherein said multijoint arm comprises at least three parallel link mechanisms which define first, second and third stages, each of said at least three parallel link mechanisms comprising a plurality of links, the first stage of said parallel link mechanisms being fixed to the base member, and, when the multijoint arm is retracted, said parallel link mechanisms are stored between the base member and the holding member such that the maximum length of the holding member is substantially equal to the maximum length of the parallel link mechanisms, wherein planes defined by said parallel link mechanisms are parallel to one another;

wherein at least one pulley is mounted on each joint of said multijoint arm, at least one of said pulleys receiving a driving force from a wire.

* * * * *